United States Patent
Passaniti et al.

(10) Patent No.: US 11,965,923 B2
(45) Date of Patent: Apr. 23, 2024

(54) SELF-TEST FOR ELECTROSTATIC CHARGE VARIATION SENSORS

(71) Applicant: STMICROELECTRONICS S.r.l., Agrate Brianza (IT)

(72) Inventors: Fabio Passaniti, Syracuse (IT); Daniele De Pascalis, Cornaredo (IT); Enrico Rosario Alessi, Catania (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 175 days.

(21) Appl. No.: 17/581,553

(22) Filed: Jan. 21, 2022

(65) Prior Publication Data
US 2023/0236234 A1 Jul. 27, 2023

(51) Int. Cl.
*G01R 29/24* (2006.01)

(52) U.S. Cl.
CPC .................... *G01R 29/24* (2013.01)

(58) Field of Classification Search
CPC ........ G01R 29/24; G01R 29/12; G01R 35/00; G01R 31/001; G01R 31/005; A61B 5/1118; A61B 5/1123; A61B 5/1126; A61B 5/7264; A61B 2562/0219; A61B 5/2415; G06F 18/24; G06F 18/24133; G06F 2218/00; G01L 19/0092; H04R 1/1016; H04R 1/1041; H04R 2420/07; H04R 2460/03; H04R 2460/15; H04R 29/00; G01D 9/005

USPC .......................................................... 324/109
See application file for complete search history.

(56) References Cited

U.S. PATENT DOCUMENTS

| | | | |
|---|---|---|---|
| 6,922,059 B2 | 7/2005 | Zank et al. | |
| 2004/0187555 A1* | 9/2004 | Zarabadi | G01P 21/00 73/1.37 |
| 2014/0232516 A1 | 8/2014 | Stivoric et al. | |
| 2016/0342781 A1 | 11/2016 | Jeon | |
| 2021/0190813 A1 | 6/2021 | Folz et al. | |

FOREIGN PATENT DOCUMENTS

| | | |
|---|---|---|
| CN | 210514599 U | 5/2020 |
| CN | 215575614 U | 1/2022 |
| EP | 2980609 A1 | 2/2016 |
| KR | 1020110061750 A | 6/2011 |

OTHER PUBLICATIONS

Janousek et al., "ST's MEMS accelerometer sensor testing & self-test," STMicroelectronics, DT0127, Rev. 1, Feb. 2019, pp. 1-8.

* cited by examiner

*Primary Examiner* — Jermele M Hollington
*Assistant Examiner* — Courtney G McDonnough
(74) *Attorney, Agent, or Firm* — Seed IP Law Group LLP

(57) ABSTRACT

The present disclosure is directed to self-tests for electrostatic charge variation sensors. The self-tests ensure an electrostatic charge variation sensor is functioning properly. The self-tests may be performed while an electrostatic charge variation sensor is active and without interruption to the application employing the electrostatic charge variation sensor.

22 Claims, 8 Drawing Sheets

SELF-TEST FOR ELECTROSTATIC CHARGE VARIATION SENSORS

BACKGROUND

Technical Field

The present disclosure is directed to self-testing for an electrostatic charge variation sensor.

Description of the Related Art

Electrostatic charge variation sensors measure electrostatic charge variation in a surrounding environment by measuring electric potential variation among one or more electrodes. Electrostatic variation may be induced on the electrodes by several different electrostatic events, such as motion of a person and presence of different low frequency power sources (e.g., an AC power line).

Electrostatic charge variation sensors may be used in a wide variety of applications and technical domains, such as room occupancy detection, presence detection, fitness and gaming applications, biopotential applications, road condition detection, and motor verification. Many of these applications, especially medical and industrial applications, demand high reliability. Electrostatic sensors with performance degradation could lead to false alarms and action triggers, and result in dire consequences.

To ensure high reliability, many devices with various sensors include self-test functions to verify that the sensors are functioning properly. Self-tests are typically performed after sensor assembly on a printed circuit board, after installation, and during operation.

BRIEF SUMMARY

The present disclosure is directed to devices and methods for performing self-tests for an electrostatic charge variation sensor. The self-tests include applying stimulus signals to the electrostatic charge variation sensor and analyzing a response of the electrostatic charge variation sensor to the stimulus signals. The self-tests may be performed while the electrostatic charge variation sensor is currently measuring electrostatic charge variation and without interruption to an application employing the electrostatic charge variation sensor (e.g., room occupancy detection, presence detection, fitness and gaming applications, biopotential applications, road condition detection, and motor verification).

BRIEF DESCRIPTION OF THE SEVERAL VIEWS OF THE DRAWINGS

In the drawings, identical reference numbers identify similar features or elements. The size and relative positions of features in the drawings are not necessarily drawn to scale.

DETAILED DESCRIPTION

In the following description, certain specific details are set forth in order to provide a thorough understanding of various aspects of the disclosed subject matter. However, the disclosed subject matter may be practiced without these specific details. In some instances, well-known structures and methods of manufacturing electronic components and sensors have not been described in detail to avoid obscuring the descriptions of other aspects of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

As discussed above, many devices with various sensors include self-test functions to ensure the sensors are functioning properly. These self-test functions typically include inducing a known signal on a sensor, and analyzing the sensor's response for an expected result. However, these types of self-tests generally stop the application employing the sensor (e.g., suspend operation of the device), execute the self-test, and re-start the application. Interrupting the application may result in loss of sensing data and processing delays.

The present disclosure is directed to a self-test for electrostatic charge variation sensors. The self-test may be performed while the electrostatic charge variation sensor is currently measuring electrostatic charge variation, without interruption to the application employing the electrostatic charge variation sensor (e.g., room occupancy detection, presence detection, fitness and gaming applications, biopotential applications, road condition detection, and motor verification).

Figure 1:
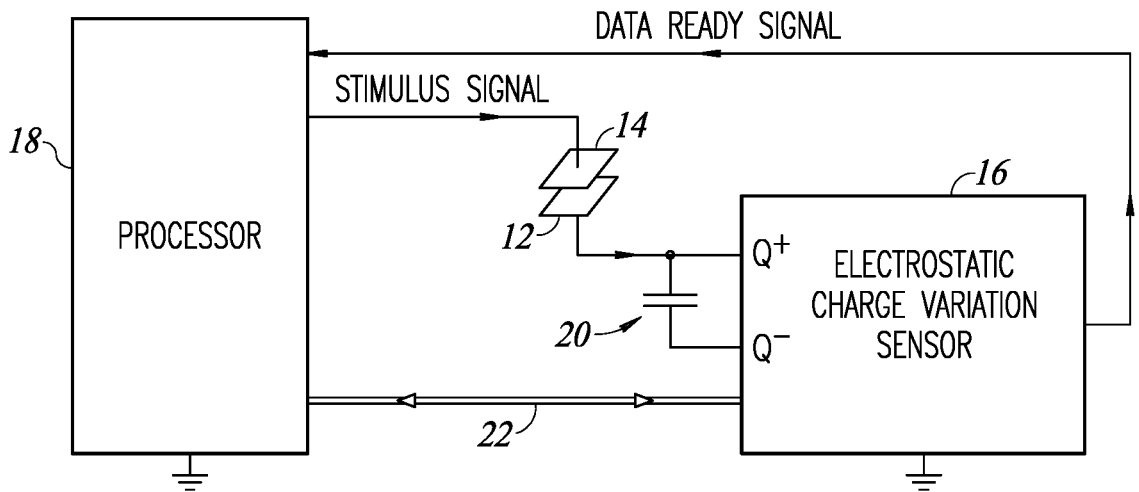
FIG. 1 is a block diagram of a device according to an embodiment disclosed herein.

FIG. 1 is a block diagram of a device 10 according to an embodiment disclosed herein. The device 10 shown in FIG. 1 includes a single receiving electrode and a single stimulus electrode.

The device 10 may be any electronic device that includes an electrostatic charge variation sensor. For example, the device 10 may be a smart watch, a fitness tracking device, wireless headphones, a laptop computer, a tablet, a cellular phone, a medical device, or an automotive device. The device 10 may also be an electrical component, such as a multi-sensor device that includes other types of sensors (e.g., an accelerometer, a pressure sensor, a gyroscope, a proximity sensor, etc.) along with the electrostatic charge variation sensor.

The device 10 includes a receiving electrode 12, a stimulus electrode 14, an electrostatic charge variation sensor 16, and a processor 18.

The receiving electrode 12 is electrically coupled to the electrostatic charge variation sensor 16. Namely, the receiving electrode 12 is electrically coupled to a first input $Q^+$ (a positive terminal) and a second input $Q^-$ (a negative terminal) of the electrostatic charge variation sensor 16. The receiving electrode 12 underlies the stimulus electrode 14. The receiving electrode 12 is made of a conductive material, such as copper.

The receiving electrode 12 detects an electrostatic charge variation in a surrounding environment. The electrostatic charge variation may be generated from a wide variety of sources, such as motion of a person and presence of different low frequency power sources (e.g., an AC power line). As will be discussed in further detail below, during a self-test, the receiving electrode 12 receives a stimulus signal transmitted from the stimulus electrode 14.

The geometry of the receiving electrode 12 determines the sensitivity of the electrode. In one embodiment, the receiving electrode 12 is square or rectangular in shape.

The stimulus electrode 14 is electrically coupled to the processor 18. The stimulus electrode 14 positioned adjacent and above the receiving electrode 12 (e.g., within 1 to 2 millimeters of the receiving electrode 12) such that the receiving electrode 12 receives a signal transmitted from the stimulus electrode 14. In one embodiment, the stimulus electrode 14 is capacitively coupled to the receiving electrode 12. The stimulus electrode 14 is made of a conductive material, such as copper.

As will be discussed in further detail below, during a self-test, the stimulus electrode 14 receives a stimulus signal from the processor 18, and transmits the stimulus signal to the receiving electrode 12. The stimulus signal will also be discussed in further detail below.

The geometry of the stimulus electrode 14 determines the directivity of the electrode. In one embodiment, the stimulus electrode 14 is square or rectangular in shape.

The electrostatic charge variation sensor 16 is electrically coupled to the processor 18 and the receiving electrode 12. In one embodiment, the electrostatic charge variation sensor 16 is embedded in a multi-sensor device that includes a plurality of different sensors (e.g., motion sensors, optical sensor, pressure sensors, etc.).

The electrostatic charge variation sensor 16 measures electrostatic charge variation (i.e., a change in electrostatic charge) detected by the receiving electrode 12. Namely, the electrostatic charge variation sensor 16 includes a first input $Q^+$ (a positive terminal) and a second input $Q^-$ (a negative terminal), and measures electrostatic charge variation detected by the receiving electrode 12 via the first input $Q^+$ and the second input $Q^-$. For example, the electrostatic charge variation sensor 16 measures electrostatic charge variation as a differential between electrical signals received by the first input $Q^+$ and the second input $Q^-$. The electrostatic charge variation sensor 16 provides the measured electrostatic charge variation as electrostatic charge variation data to the processor 18.

In one embodiment, a capacitor 20 is electrically coupled between the first input $Q^+$ and the second input $Q^-$. The capacitor 20 receives and stores the electrostatic charge variation received by the receiving electrode 12. In this embodiment, the electrostatic charge variation sensor 16 measures electrostatic charge variation stored in the capacitor 20.

As will be discussed in further detail below, during a self-test, the electrostatic charge variation sensor 16 measures electrostatic charge variation detected by the receiving electrode 12 when the stimulus electrode 14 is transmitting a stimulus signal, and when the stimulus electrode 14 is not transmitting a stimulus signal.

The electrostatic charge variation sensor 16 includes various electronic components (e.g., capacitors, resistors, amplifiers, etc.) to measure electrostatic charge variation. The electrostatic charge variation sensor 16, for example, includes filters to remove certain frequencies from a measured electrostatic charge variation signal, amplifiers to boost a measured electrostatic charge variation signal, and an analog-to-digital converter to convert the measured electrostatic charge variation signal to a digital value and output electrostatic charge variation data as a digital value.

The electrostatic charge variation sensor 16 also generates and provides a data ready signal to the processor 18. The data ready signal is an interrupt signal that informs the processor 18 that electrostatic charge variation data is ready for processing. Upon receiving the data ready signal, the processor 18 may retrieve or receive electrostatic charge variation data from the electrostatic charge variation sensor 16 via, for example, a communication bus 22. The communication bus 22 is a bi-directional channel that allows the electrostatic charge variation sensor 16 and the processor 18 to communicate with each other.

The processor 18 is electrically coupled to the stimulus electrode 14 and the electrostatic charge variation sensor 16. The processor 18 may be any type of processor, controller, or microcontroller that is able to process data.

As discussed above, the processor 18 generates and provides a stimulus signal to the stimulus electrode 14 for transmission. In addition, the processor 18 receives electrostatic charge variation data, which are measurements by the electrostatic charge variation sensor 16, from the electrostatic charge variation sensor 16 in response to a data ready signal.

Figure 2:
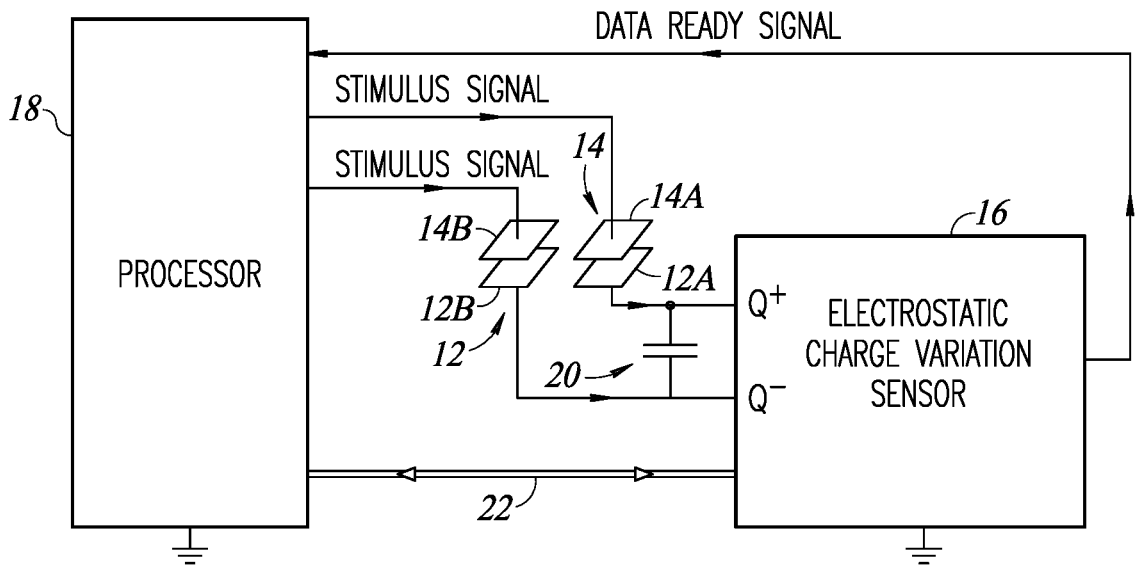
FIG. 2 is a block diagram of a device according to another embodiment disclosed herein.

In the embodiment shown in FIG. 1, the device 10 includes a single receiving electrode and a single stimulus electrode. However, the device 10 may include any number of receiving and stimulus electrodes. FIG. 2 is a block diagram of the device 10 according to another embodiment disclosed herein.

Similar to the embodiment shown in FIG. 1, the device 10 in FIG. 2 includes an electrostatic charge variation sensor 16 and a processor 18. However, in contrast to the embodiment shown in FIG. 1, the device 10 includes two receiving electrodes 12 and two stimulus electrodes 14.

Each of the receiving electrodes 12 is electrically coupled to the electrostatic charge variation sensor 16. Namely, a first receiving electrode 12A is electrically coupled to the first input $Q^+$ (a positive terminal) of the electrostatic charge variation sensor 16, and a second receiving electrode 12B is electrically coupled to the second input $Q^-$ (a negative terminal) of the electrostatic charge variation sensor 16.

Each of the stimulus electrodes 14 is electrically coupled to the processor 18. In the embodiment shown in FIG. 2, a first stimulus electrode 14A receives a first stimulus signal from the processor 18, and a second stimulus electrode 14B receives a second stimulus signal from the processor 18.

Each of the stimulus electrodes 14 is positioned adjacent to and above a respective receiving electrode 12 (e.g., within 1 to 2 millimeters of the receiving electrode 12) such that the respective receiving electrode 12 receives a signal transmitted from the stimulus electrode 14. In one embodiment, the each of the stimulus electrodes 14 is capacitively coupled to a respective receiving electrode 12. In the embodiment shown in FIG. 2, the first receiving electrode 12A receives a stimulus signal transmitted from the first stimulus electrode 14A, and the second receiving electrode 12B receives a stimulus signal transmitted from the second stimulus electrode 14B. As the stimulus electrodes 14A and 14B overlie the receiving electrodes 12A and 12B, respectively, the first and second stimulus electrodes 14A and 14B may act as shields for the receiving electrodes 12A and 12B, respectively.

Figure 3:
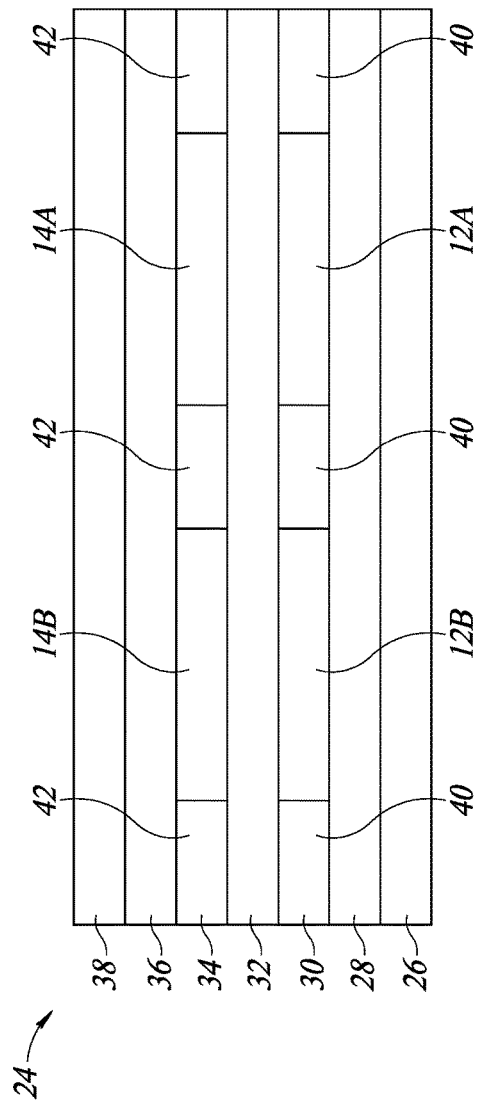
FIG. 3 is a cross-sectional view of a substrate including receiving electrodes and stimulus electrodes according to an embodiment disclosed herein.

In one embodiment, the receiving electrode(s) 12 and the stimulus electrode(s) 14 are hidden and embedded within a substrate (e.g., a printed circuit board) supporting various components (e.g., the electrostatic charge variation sensor 16, the processor 18, etc.) of the device 10. For example, FIG. 3 is a cross-sectional view of a substrate 24 including the first and second receiving electrodes 12A and 12B and the first and second stimulus electrodes 14A and 14B according to an embodiment disclosed herein. In this embodiment, the substrate 24 is a printed circuit board.

The substrate 24 includes a first overlay layer 26, a first solder mask layer 28 on the first overlay layer 26, a first signal layer 30 on the first solder mask layer 28, a dielectric layer 32 on the first signal layer 30, a second signal layer 34 on the dielectric layer 32, a second solder mask layer 36 on the second signal layer 34, and a second overlay layer 38 on the second solder mask layer 36.

The first overlay layer 26 and the second overlay layer 38 are outer layers that are exposed to a surrounding environment. The first overlay layer 26 and the second overlay layer 38 may be used to label various components on the substrate 24.

The first solder mask layer 28 and the second solder mask layer 36 are protective and insulating layers for electrical components and electrical connections included on the substrate 24.

The first signal layer 30 and the second signal layer 34 are signal layers for making electrical connections among the electrical components placed on the printed circuit board. The first signal layer 30 includes the first and second receiving electrodes 12A and 12B, and the second signal layer 34 includes the first and second stimulus electrodes 14A and 14B. The first and second receiving electrodes 12A and 12B are spaced from each other by a dielectric layer 40, and the first and second stimulus electrodes 14A and 14B are spaced from each other by a dielectric layer 42.

The dielectric layer 32 is between the first signal layer 30 and the second signal layer 34. The first and second receiving electrodes 12A and 12B and the first and second stimulus electrodes 14A and 14B are spaced from each other by the dielectric layer 32. The dielectric layer 32 is sufficiently thin such that the first receiving electrode 12A is able to be capacitively coupled with the first stimulus electrode 14A and receive a stimulus signal transmitted from the first stimulus electrode 14A, and the second receiving electrode 12B is able to be capacitively coupled with the second stimulus electrode 14B and receive a stimulus signal transmitted from the second stimulus electrode 14B. In one embodiment, the dielectric layer 32 is 1 to 2 millimeters thick.

Although two signal layers are shown in FIG. 3, the substrate 24 may include any number of signal layers. For example, the substrate 24 may include 4, 8, or more signal layers, with two external signal layers stacked as shown in FIG. 3 and additional signal layers positioned in the middle of the stack (following the pattern of metal-dielectric-metal-dielectric-metal and so on).

The device 10 is configured to perform various self-tests to determine whether an electrostatic charge variation sensor is functioning properly (e.g., accurately measuring electrostatic charge variation). Namely, the device 10 is configured to perform a zero self-test, an offset self-test, and a performance self-test. The self-tests may be performed individually or in combination with each other. Each of the self-tests will be described in turn below.

The zero self-test includes applying a constant voltage signal to the stimulus electrode(s). In the embodiment shown in FIG. 1, the stimulus signal applied to the stimulus electrode 14 is the constant voltage signal. In the embodiment shown in FIG. 2, each of the stimulus signals applied to the first stimulus electrode 14A and the second stimulus electrode 14B is the constant voltage signal. A single constant voltage signal may also be applied to both the first stimulus electrode 14A and the second stimulus electrode 14B.

Figure 4:
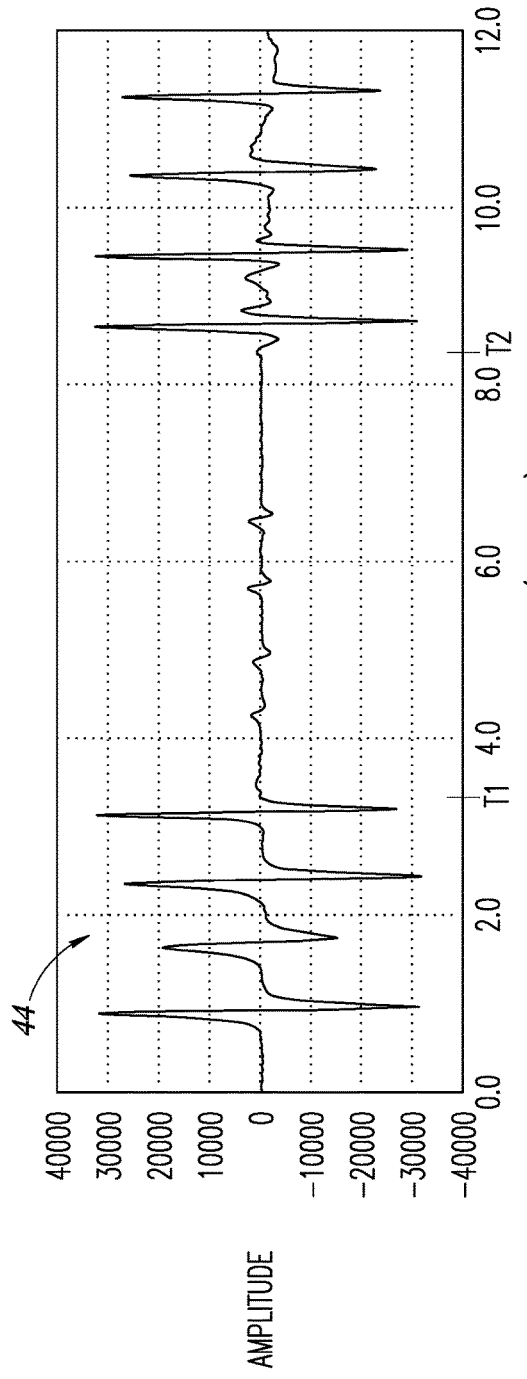
FIG. 4 shows an electrostatic charge variation signal during a zero self-test according to an embodiment disclosed herein.

When a constant voltage is applied to a stimulus electrode(s), the stimulus electrode(s) blocks electrostatic charge variation and acts as a shield for the receiving electrode(s). As a result, the electrostatic charge variation induced on the receiving electrode by an external source is strongly attenuated. For example, FIG. 4 shows an electrostatic charge variation signal 44 during a zero self-test according to an embodiment disclosed herein. The electrostatic charge variation signal 44 is generated by the electrostatic charge variation sensor 16. The horizontal axis is a time axis, and the vertical axis is an amplitude axis. The amplitude of the electrostatic charge variation signal is a digital output value of the electrostatic charge variation sensor 16 that represents a measured electrostatic charge variation.

Before time T1, electrostatic charge variation is in a surrounding environment and being measured by the electrostatic charge variation sensor 16. Further, no stimulus signal is applied to the stimulus electrode (the stimulus electrode 14 in FIG. 1 or the stimulus electrodes 14A and 14B in FIG. 2). For example, the output of the processor 18 may be set in a high impedance mode. As a result, before time T1, the amplitude of the electrostatic charge variation signal 44 varies due to the electrostatic charge variation in the surrounding environment.

Between times T1 and T2, electrostatic charge variation is still present in the surrounding environment and being measured by the electrostatic charge variation sensor 16. However, a stimulus signal (a constant voltage signal) is applied to the stimulus electrode (the stimulus electrode 14 in FIG. 1 or the stimulus electrodes 14A and 14B in FIG. 2). As a result, between times T1 and T2, the amplitude of the electrostatic charge variation signal 44 is reduced. For example, the electrostatic charge variation signal 44 has an attenuation of about 12 decibels.

After time T2, the electrostatic charge variation is still present in the surrounding environment and being measured by the electrostatic charge variation sensor 16, and the stimulus signal is stopped. As a result, after time T2, the amplitude of the electrostatic charge variation signal 44 varies again.

The zero self-test is executed when a significant signal is detected by the electrostatic charge variation sensor 16. For example, the electrostatic charge variation sensor 16 is currently measuring electrostatic charge variation for an application employing the electrostatic charge variation sensor 16 (e.g., room occupancy detection, presence detection, fitness and gaming applications, biopotential applications, road condition detection, and motor verification). Executing the zero-self test while the electrostatic charge variation sensor 16 is detecting a significant signal permits checking if a measured electrostatic charge variation signal is generated externally to the electrostatic charge variation sensor 16 (e.g., due to environment noise, electrostatic fields, user activity, monitored appliances, etc.) or generated internally (e.g., due to system or device malfunction). A reduction of the amplitude of the measured electrostatic charge variation signal when a constant voltage signal is applied to the stimulus electrode(s) confirms that the measured electrostatic charge variation signal is caused by a source external to the sensor, and that the electrostatic charge variation sensor 16 is functioning properly. Conversely, the amplitude of the measured electrostatic charge variation signal remaining constant (i.e., not reducing or attenuating) when a constant voltage signal is applied to the stimulus electrode(s) confirms that the measured electrostatic charge variation signal is caused internally, and that the electrostatic charge variation sensor 16 is malfunctioning. The zero self-test does not need advanced analysis on the measured electrostatic charge variation (e.g., frequency or noise spectrum analysis) for understanding whether electrostatic charge variation is generated externally or internally to the electrostatic charge variation sensor 16.

Figure 5:
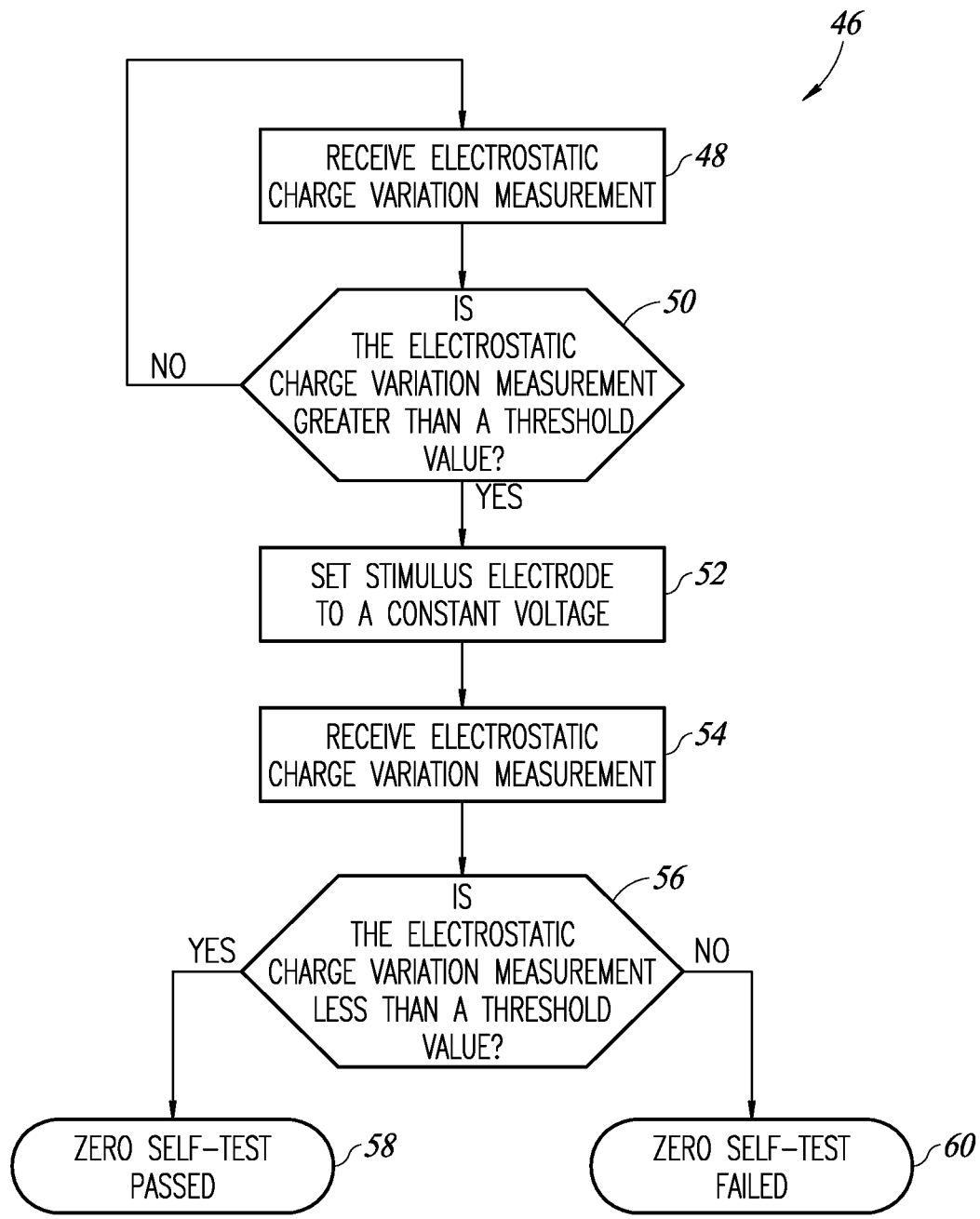
FIG. 5 is a flow diagram of a method for performing a zero self-test according to an embodiment disclosed herein.

FIG. 5 is a flow diagram of a method 46 for performing a zero self-test according to an embodiment disclosed herein.

In block 48, the processor 18 receives an electrostatic charge variation measurement from the electrostatic charge variation sensor 16. For example, the processor 18 receives the electrostatic charge variation measurement as electrostatic charge variation data through the communication bus 22. As discussed above, the electrostatic charge variation sensor 16 measures electrostatic charge variation induced upon the receiving electrode(s). The electrostatic charge variation measurement is a measurement taken when no stimulus signal is applied to the stimulus electrode(s).

In block 50, the processor 18 determines whether the electrostatic charge variation measurement received in block 48 is greater than a threshold value. An electrostatic charge variation measurement greater than the threshold value indicates that electrostatic charge variation sensor 16 is currently measuring a significant signal.

In a case where the electrostatic charge variation measurement received in block 48 is not greater than the threshold value, the method 46 returns to block 48 where another electrostatic charge variation measurement is received.

In a case where the electrostatic charge variation measurement received in block 48 is greater than the threshold value, the method 46 moves to block 52.

In block 52, the stimulus electrode is set to a constant voltage as discussed above. In the embodiment shown in FIG. 1, the stimulus signal applied to the stimulus electrode 14 is a constant voltage signal. In the embodiment shown in FIG. 2, the stimulus signals applied to the first stimulus electrode 14A and the second stimulus electrode 14B are constant voltage signals. A single constant voltage signal may also be applied to both the first stimulus electrode 14A and the second stimulus electrode 14B.

In block 54, the processor 18 receives another electrostatic charge variation measurement from the electrostatic charge variation sensor 16. In contrast to the measurement in block 48, the electrostatic charge variation measurement in block 54 is a measurement taken while the stimulus electrode(s) are set to constant voltage in block 52.

In block 56, the processor 18 determines whether the electrostatic charge variation measurement received in block 54 is less than a threshold value. In one embodiment, the threshold value in block 56 is less than the threshold value in block 50. As discussed above, a reduction of the amplitude of the measured electrostatic charge variation when a constant voltage signal is applied to the stimulus electrode(s) confirms that the measured electrostatic charge variation is caused by a source external to the sensor, and that the electrostatic charge variation sensor 16 is functioning properly. Conversely, the amplitude of the measured electrostatic charge variation remaining constant (i.e., not reducing or attenuating) when a constant voltage signal is applied to the stimulus electrode(s) confirms that the measured electrostatic charge variation is caused internally, and that the electrostatic charge variation sensor 16 is functioning properly.

In a case where the electrostatic charge variation measurement received in block 54 is less than the threshold value, the method 46 moves to block 58 where the processor 18 determines the electrostatic charge variation sensor 16 has passed the zero self-test and is functioning properly.

In a case where the electrostatic charge variation measurement received in block 54 is not less than the threshold value, the method 46 moves to block 60 where the processor 18 determines the electrostatic charge variation sensor 16 has failed the zero self-test and is malfunctioning.

In one embodiment, the zero self-test results are subsequently outputted from the processor 18 for further processing. For example, the device 10 may halt processing of the device 10 or output a warning to a user of the device 10 upon failure of the zero self-test.

The offset self-test includes applying a synchronous pulsed signal, which is synchronized with the output data rate of the electrostatic charge variation sensor 16, to the stimulus electrode. In one embodiment, the output data rate is set at a determined frequency. In the embodiment shown in FIG. 1, the stimulus signal applied to the stimulus electrode 14 is the synchronous pulsed signal. In the embodiment shown in FIG. 2, the stimulus signal applied to the first stimulus electrode 14A is the synchronous pulsed signal. In one embodiment, the stimulus signal applied to the second stimulus electrode 14B is also set to a constant voltage signal such that the second stimulus electrode 14B acts as a shield for the second stimulus electrode 14B and reduces noise on the second stimulus electrode 14B. In another embodiment, no stimulus signal is applied to the second stimulus electrode 14B. In another embodiment, the stimulus signal applied to the second stimulus electrode 14B is complementary to and opposite in phase with the stimulus signal applied to the first stimulus electrode 14A (e.g., the stimulus signal applied to the second stimulus electrode 14B is inverted with respect to the stimulus signal applied to the first stimulus electrode 14A). In this embodiment, as the electrostatic charge variation sensor 16 measures a difference between the first input $Q^+$ and the second input $Q^-$, noise, which is common to both inputs, will be canceled or at least strongly attenuated. Further, as the first and key signals are complementary and opposite in phase at the first input $Q^+$ and the second input $Q^-$, the data signal will be doubled. As a result, the signal to noise ratio of the device 10 is greatly improved.

The synchronous pulse signal is synchronized with the output data rate through the data ready signal. As discussed above, the data ready signal is output from the electrostatic charge variation sensor 16 and informs the processor 18 that electrostatic charge variation data is ready for processing. A pulse (e.g., a voltage signal between 1.8 and 3.3 volts) is applied to and output from the stimulus electrode in sync with the data ready signal being outputted from the electrostatic charge variation sensor 16. As a result, the stimulus electrode outputs a signal that is the same as the data ready signal. In one embodiment, the processor 18 receives the data ready signal from the electrostatic charge variation sensor 16, and outputs the synchronous pulse signal in sync with the data ready signal. In another embodiment, the data ready signal is applied directed to the stimulus electrode, without intervention from the processor 18.

Figure 6:
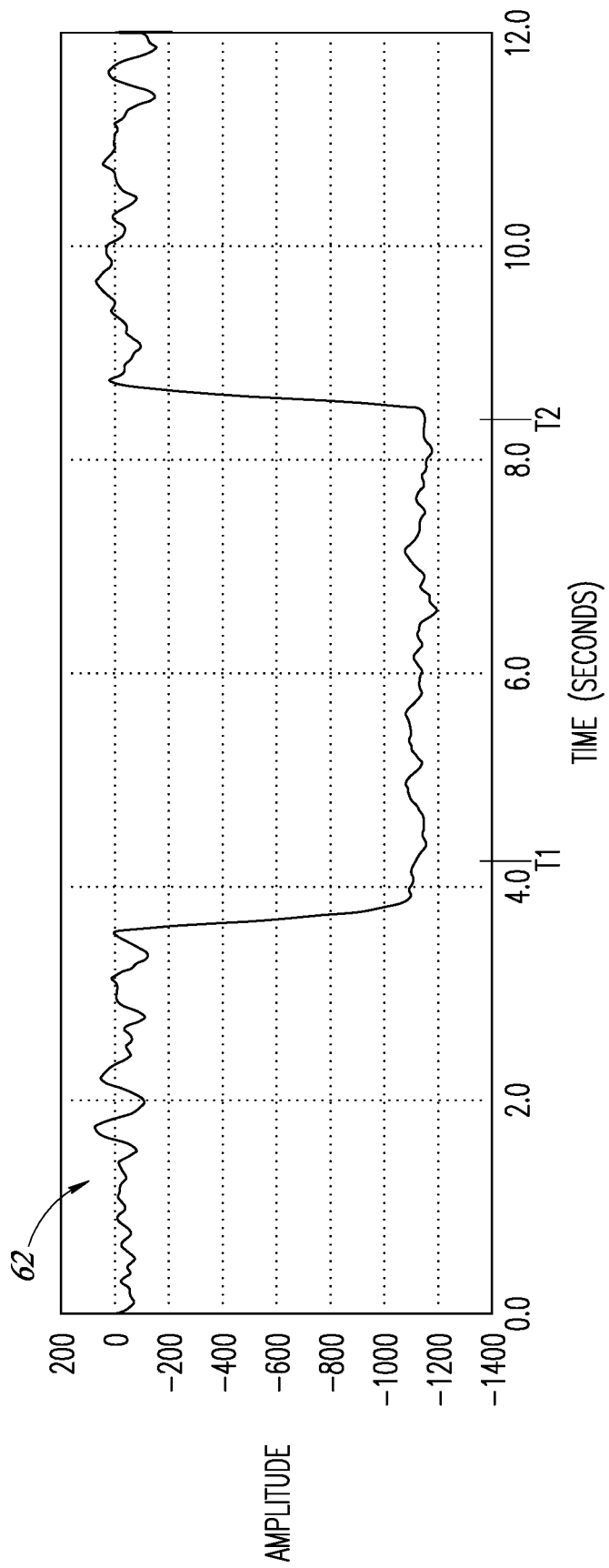
FIG. 6 shows an electrostatic charge variation signal during an offset self-test according to an embodiment disclosed herein.

When the synchronous pulse signal is synchronized with the output data rate of the electrostatic charge variation sensor 16, an offset signal is generated in the output data of the electrostatic charge variation sensor 16, due to the stimulus frequency of the electrostatic charge variation sensor 16 being equal to the output data rate of the electrostatic charge variation sensor 16. Stated differently, the output of the electrostatic charge variation sensor 16 will show a continuous voltage, non-alternating, offset with respect to its initial level. For example, FIG. 6 shows an electrostatic charge variation signal 62 during an offset self-test according to an embodiment disclosed herein. The electrostatic charge variation signal 62 is generated by the electrostatic charge variation sensor 16. The horizontal axis is a time axis, and the vertical axis is an amplitude axis. The amplitude of the electrostatic charge variation signal is a digital output value of the electrostatic charge variation sensor 16 that represents a measured electrostatic charge variation.

Before time T1, electrostatic charge variation in a surrounding environment is measured by the electrostatic charge variation sensor 16. However, no electrostatic charge variation is present in the surrounding environment in FIG. 6, so the electrostatic charge variation 62 is near zero. Further, no stimulus signal is applied to the stimulus electrode (the stimulus electrode 14 in FIG. 1 or the stimulus electrode 14A in FIG. 2). As a result, before time T1, the amplitude of the electrostatic charge variation signal 62 remains near zero.

Between times T1 and T2, electrostatic charge variation is still not present in the surrounding environment. However, a stimulus signal (a synchronous pulse signal) is applied to the stimulus electrode (the stimulus electrode 14 in FIG. 1 or the stimulus electrode 14A in FIG. 2). As a result, between times T1 and T2, the amplitude of the electrostatic charge variation signal 62 is offset from zero. For example, the electrostatic charge variation signal 62 reduces to about −1200.

After time T2, electrostatic charge variation is still not present in the surrounding environment, and the stimulus signal is stopped. As a result, after time T2, the amplitude of the electrostatic charge variation signal 62 returns to near zero.

The offset self-test is executed when a significant signal is not detected by the electrostatic charge variation sensor 16. For example, the electrostatic charge variation sensor 16 is not currently measuring electrostatic charge variation for an application employing the electrostatic charge variation sensor 16. Executing the offset self-test while a significant signal is undetected permits checking if an offset is due to an absence of an electrostatic charge variation source (e.g., environment noise, electrostatic fields, user activity, monitored appliances, etc.) or due to a system or device malfunction (e.g., malfunction of the electrostatic charge variation sensor 16 or another component of the device 10). An offset in the amplitude of the measured electrostatic charge variation when a synchronous pulse signal is applied to the stimulus electrode confirms that the offset of the measured electrostatic charge variation is due to an absence of an electrostatic charge variation source, and that the electrostatic charge variation sensor 16 is functioning properly. Conversely, the amplitude of the measured electrostatic charge variation remaining at its initial level (i.e., not being further offset) confirms that an offset of the measured electrostatic charge variation is due to a system or device malfunction.

Figure 7:
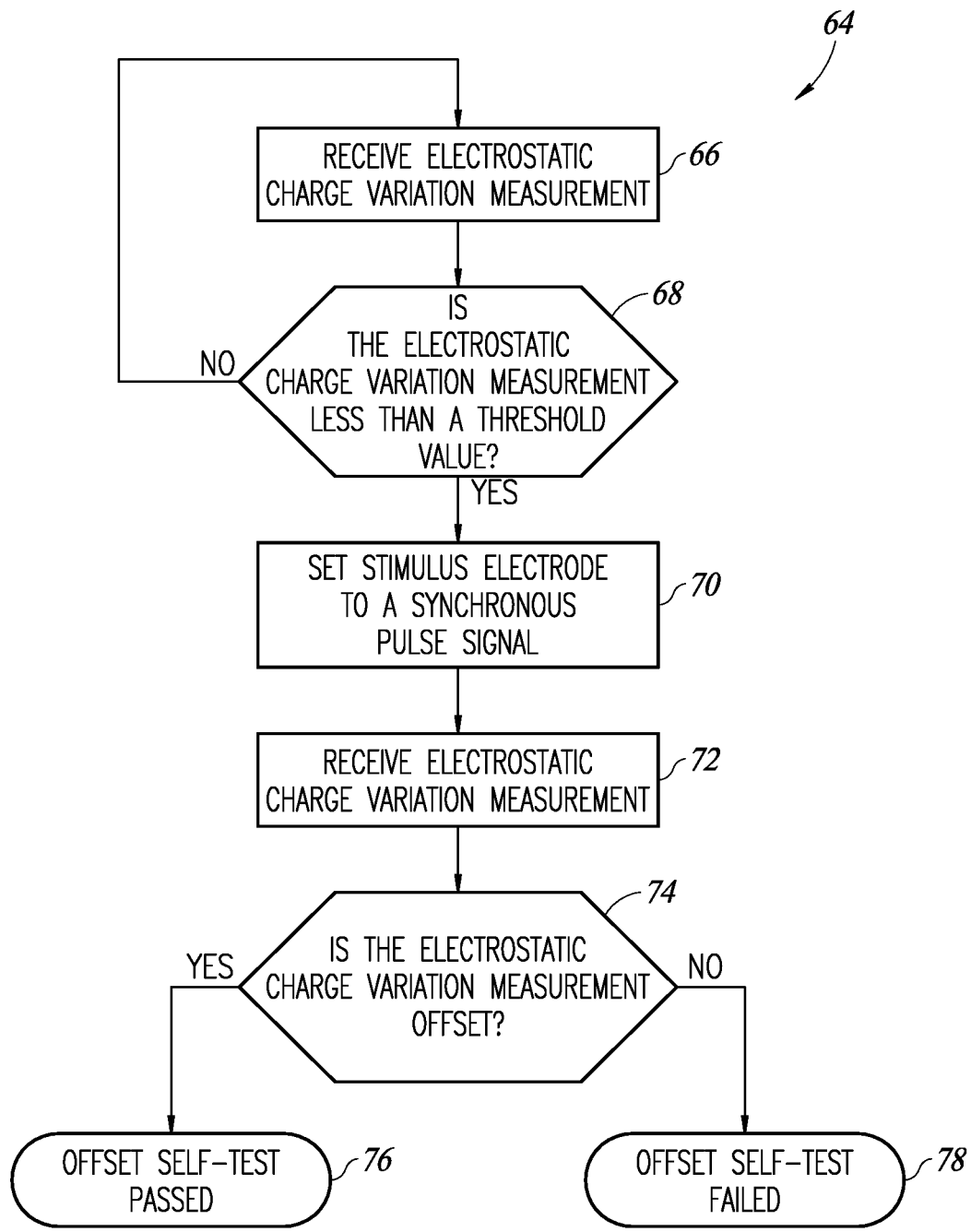
FIG. 7 is a flow diagram of a method for performing an offset self-test according to an embodiment disclosed herein.

FIG. 7 is a flow diagram of a method 64 for performing an offset self-test according to an embodiment disclosed herein.

In block 66, the processor 18 receives an electrostatic charge variation measurement from the electrostatic charge variation sensor 16. For example, the processor 18 receives the electrostatic charge variation measurement as electrostatic charge variation data through the communication bus 22. As discussed above, the electrostatic charge variation sensor 16 measures electrostatic charge variation induced upon the receiving electrode. The electrostatic charge variation measurement is a measurement taken when no stimulus signal is applied to the stimulus electrode.

In block 68, the processor 18 determines whether the electrostatic charge variation measurement received in block 66 is less than a threshold value. An electrostatic charge variation measurement less than the threshold value indicates that no electrostatic charge variation is present in a surrounding environment.

In a case where the electrostatic charge variation measurement received in block 66 is not less than the threshold value, the method 64 returns to block 66 where another electrostatic charge variation measurement is received.

In a case where the electrostatic charge variation measurement received in block 66 is less than the threshold value, the method 64 moves to block 70.

In block 70, the stimulus electrode is set to a synchronous pulse signal as discussed above. In the embodiment shown in FIG. 1, the stimulus signal applied to the stimulus electrode 14 is the synchronous pulsed signal. In the embodiment shown in FIG. 2, the stimulus signal applied to the first stimulus electrode 14A is the synchronous pulsed signal. In one embodiment, as discussed above, the stimulus signal applied to the second stimulus electrode 14B is also set to a constant voltage signal such that the second stimulus electrode 14B acts as a shield for the second stimulus electrode 14B and reduces noise on the second stimulus electrode 14B. In another embodiment, no stimulus signal is applied to the second stimulus electrode 14B. In another embodiment, the stimulus signal applied to the second stimulus electrode 14B is complementary to and opposite in phase with the stimulus signal applied to the first stimulus electrode 14A.

In block 72, the processor 18 receives another electrostatic charge variation measurement from the electrostatic charge variation sensor 16. In contrast to the measurement in block 66, the electrostatic charge variation measurement in block 72 is a measurement taken while the stimulus electrode is set to the synchronous pulse signal in block 70.

In block 74, the processor 18 determines whether the electrostatic charge variation measurement received in block 72 is offset from the measurement in block 66. As discussed above, an offset in the amplitude of the measured electrostatic charge variation when a synchronous pulse signal is applied to the stimulus electrode confirms that the absence of a significant signal of electrostatic charge variation is due to an absence of an electrostatic charge variation source, and that the electrostatic charge variation sensor 16 is functioning properly. Conversely, the amplitude of the measured electrostatic charge variation remaining at its initial level (i.e., not being further offset) confirms that the absence of a significant signal of electrostatic charge variation is due to a system or device malfunction.

In a case where the electrostatic charge variation measurement received in block 72 is offset, the method 64 moves to block 76 where the processor 18 determines the electrostatic charge variation sensor 16 has passed the offset self-test and is functioning properly.

In a case where the electrostatic charge variation measurement received in block 72 is not offset, the method 64 moves to block 78 where the processor 18 determines the electrostatic charge variation sensor 16 has failed the offset self-test and is malfunctioning.

In one embodiment, the offset self-test results are subsequently outputted from the processor 18 for further processing. For example, the device 10 may halt processing of the device 10 or output a warning to a user of the device 10 upon failure of the offset self-test.

In contrast to the offset self-test, the performance self-test includes applying an asynchronous signal, which is unsynchronized with the output data rate of the electrostatic charge variation sensor 16, to the stimulus electrode. In the embodiment shown in FIG. 1, the stimulus signal applied to the stimulus electrode 14 is the asynchronous signal. In the embodiment shown in FIG. 2, the stimulus signal applied to the first stimulus electrode 14A is the asynchronous signal. In one embodiment, the stimulus signal applied to the second stimulus electrode 14B is also set to a constant voltage signal such that the second stimulus electrode 14B acts as a shield for the second stimulus electrode 14B and reduces noise on the second stimulus electrode 14B. In another embodiment, no stimulus signal is applied to the second stimulus electrode 14B. In another embodiment, the stimulus signal applied to the second stimulus electrode 14B is complementary to and opposite in phase with the stimulus signal applied to the first stimulus electrode 14A.

The asynchronous signal is unsynchronized with the output data rate (e.g., the data ready signal) of the electrostatic charge variation sensor 16. More specifically, the asynchronous signal is a periodic signal (e.g., a square wave and a sinusoidal wave) that has a lower frequency than the output data rate and is out of phase with the output data rate.

When the asynchronous signal is applied to and transmitted from the stimulus electrode (the stimulus electrode 14 in FIG. 1 or the stimulus electrode 14A in FIG. 2) and received by the receiving electrode (the receiving electrode 12 in FIG. 1 or the receiving electrode 12A in FIG. 2), the electrostatic charge variation sensor 16 measures and outputs a periodic signal that is shaped by a transfer function of the electrostatic charge variation sensor 16. The transfer function is determined by characteristics of system elements of the device 10, such as the receiving electrode(s) 12, the stimulus electrode(s) 14, internal settings and processing filters of the electrostatic charge variation sensor 16, the processor 18, and various other components external and connected to the electrostatic charge variation sensor 16.

In a case where the asynchronous signal is a square wave, various time-domain attributes of the output periodic signal will be shaped by the transfer function of the electrostatic charge variation sensor 16. For example, rise time, fall time, peak-to-peak amplitude, offset sensitivity, signal to noise ratio, and amplitude distortion of the output periodic signal will change depending on the transfer function of the electrostatic charge variation sensor 16.

In a case where the asynchronous signal is a sinusoidal wave, various frequency-domain attributes of the output periodic signal will be shaped by the transfer function of the electrostatic charge variation sensor 16. For example, frequency response, time constant, sensitivity, signal to noise ratio, harmonic distortion, and common mode rejection ratio (CMRR) of the output periodic signal will change depending on the transfer function of the electrostatic charge variation sensor 16.

The performance self-test is executed when a significant signal is not detected by the electrostatic charge variation sensor 16. For example, the electrostatic charge variation sensor 16 is not currently measuring electrostatic charge variation for an application employing the electrostatic charge variation sensor 16. As the transfer function of the electrostatic charge variation sensor 16 is determined by various system elements of the device 10, executing the performance self-test while a significant signal is undetected permits checking if there is any change in performance of the device 10 as a whole. If the output periodic signal of the electrostatic charge variation sensor 16 remains the same or is similar to a previous output periodic signal, there is no change in performance of the device 10 and the device 10 is functioning properly. Conversely, if the output periodic signal of the electrostatic charge variation sensor 16 is different from a previous output periodic signal, there is a change in performance of the device 10 and the device 10 is malfunctioning.

Figure 8:
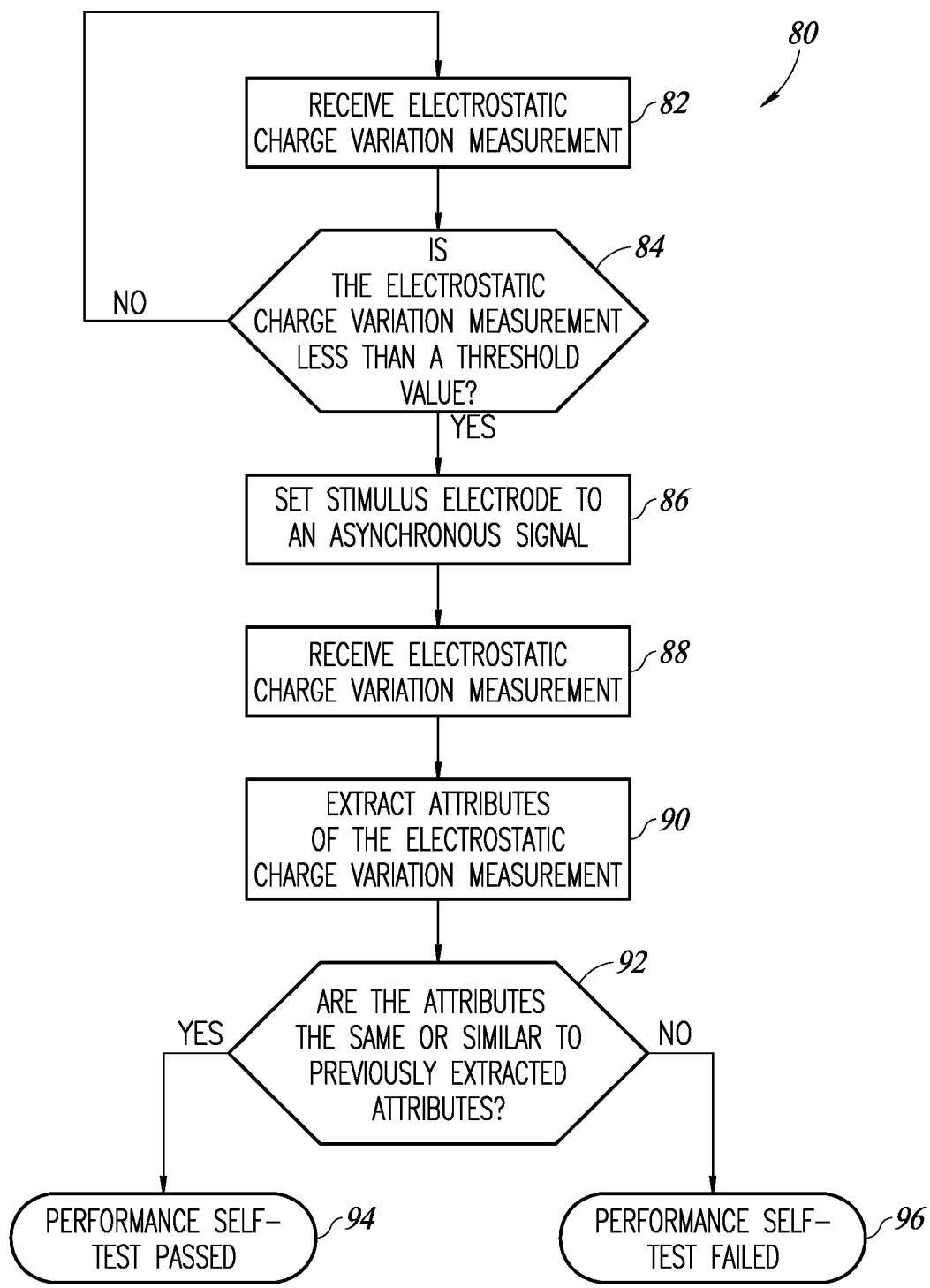
FIG. 8 is a flow diagram of a method for performing a performance self-test according to an embodiment disclosed herein.

FIG. 8 is a flow diagram of a method 80 for performing a performance self-test according to an embodiment disclosed herein.

In block 82, the processor 18 receives an electrostatic charge variation measurement from the electrostatic charge variation sensor 16. For example, the processor 18 receives the electrostatic charge variation measurement as electrostatic charge variation data through the communication bus 22. As discussed above, the electrostatic charge variation sensor 16 measures electrostatic charge variation induced upon the receiving electrode(s). The electrostatic charge variation measurement is a measurement taken when no stimulus signal is applied to the stimulus electrode(s).

In block 84, the processor 18 determines whether the electrostatic charge variation measurement received in block 82 is less than a threshold value. An electrostatic charge variation measurement less than the threshold value indicates that no electrostatic charge variation is present in a surrounding environment.

In a case where the electrostatic charge variation measurement received in block 82 is not less than the threshold value, the method 80 returns to block 82 where another electrostatic charge variation measurement is received.

In a case where the electrostatic charge variation measurement received in block 82 is less than the threshold value, the method 80 moves to block 86.

In block 86, the stimulus electrode is set to an asynchronous signal as discussed above. In the embodiment shown in FIG. 1, the stimulus signal applied to the stimulus electrode 14 is the asynchronous signal. In the embodiment shown in FIG. 2, the stimulus signal applied to the first stimulus electrode 14A is the asynchronous signal. In one embodiment, as discussed above, the stimulus signal applied to the second stimulus electrode 14B is also set to a constant voltage signal such that the second stimulus electrode 14B acts as a shield for the second stimulus electrode 14B and reduces noise on the second stimulus electrode 14B. In another embodiment, no stimulus signal is applied to the second stimulus electrode 14B. In another embodiment, the stimulus signal applied to the second stimulus electrode 14B is complementary to and opposite in phase with the stimulus signal applied to the first stimulus electrode 14A.

In block 88, the processor 18 receives another electrostatic charge variation measurement from the electrostatic charge variation sensor 16. In contrast to the measurement in block 82, the electrostatic charge variation measurement in block 88 is a measurement taken while the stimulus electrode is set to the asynchronous signal in block 86.

In block 90, the processor 18 performs advanced analysis (e.g., frequency spectrum, noise spectrum, statistical evaluations) on the electrostatic charge variation measurement in block 88 to extract various attributes or parameters of the electrostatic charge variation measurement in block 88. The processor 18 extracts attributes that change depending on the transfer function of the electrostatic charge variation sensor 16 as discussed above. For example, in a case where the asynchronous signal in block 86 is a square wave, one or more time-domain attributes (e.g., rise time, fall time, peak-to-peak amplitude, offset sensitivity, signal to noise ratio, and amplitude distortion) of the electrostatic charge variation measurement in block 88 is extracted. In a case where the asynchronous signal is a sinusoidal wave, one or more frequency-domain attributes (e.g., frequency response, time constant, sensitivity, signal to noise ratio, harmonic distortion, and common mode rejection ratio (CMRR)) of the electrostatic charge variation measurement in block 88 is extracted.

In block 92, the processor 18 determines whether the attributes extracted in block 90 are the same or similar to previously extracted attributes. For example, the processor 18 determines whether an attribute is within a threshold value of the same attribute that was previously extracted. The previously extracted attributes are stored attribute values that were determined in block 90 in a prior execution of the method 80.

In a case where the attributes extracted in block 90 are the same or similar to previously extracted attributes, the method 80 moves to block 94 where the processor 18 determines the device 10 has passed the performance self-test and is functioning properly.

In a case where the attributes extracted in block 90 are not the same or similar to previously extracted attributes, the method 80 moves to block 96 where the processor 18 determines the device 10 has failed the performance self-test and is malfunctioning.

In one embodiment, the performance self-test results are subsequently outputted from the processor 18 for further processing. For example, the device 10 may halt processing of the device 10 or output a warning to a user of the device 10 upon failure of the performance self-test.

Figure 9:
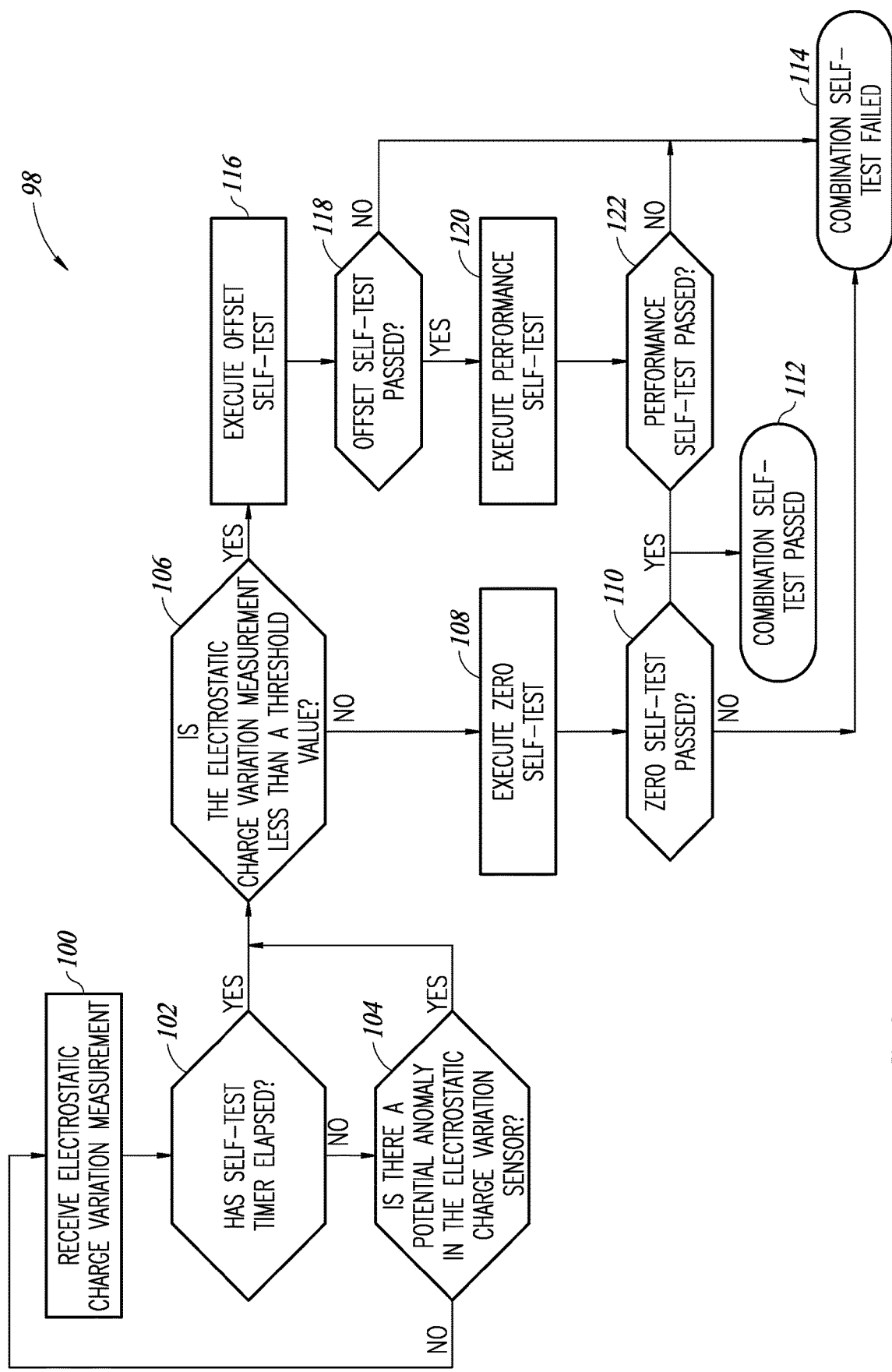
FIG. 9 is a flow diagram of a method for performing a combination self-test according to an embodiment disclosed herein.

The zero self-test, the offset self-test, and the performance self-test may also be performed in combination with each other as a single self-test. FIG. 9 is a flow diagram of a method 98 for performing a combination self-test according to an embodiment disclosed herein. The method 98 includes the zero self-test, the offset self-test, and the performance self-test as described above.

In block 100, the processor 18 receives an electrostatic charge variation measurement from the electrostatic charge variation sensor 16. For example, the processor 18 receives the electrostatic charge variation measurement as electrostatic charge variation data through the communication bus 22. As discussed above, the electrostatic charge variation sensor 16 measures electrostatic charge variation induced upon the receiving electrode(s). The electrostatic charge variation measurement is a measurement taken when no stimulus signal is applied to the stimulus electrode(s).

In block 102, the processor 18 determines whether a self-test timer has elapsed. The self-test timer is used to initiate the combination self-test. Namely, the combination self-test is started when the self-test time has elapsed. The self-test timer is set to a determined value (e.g., 5 seconds, 10 seconds, etc.) when the method 98 begins to execute and counts down to zero.

In a case where the self-test timer has elapsed, the method 98 moves to block 106. Block 106 will be discussed below.

In a case where the self-test timer has not elapsed, the method 98 moves to block 104.

In block 104, the processor 18 determines whether there is a potential anomaly in the electrostatic charge variation sensor 16. Stated differently, the processor 18 determines whether there is any indication that the electrostatic charge variation sensor 16 is malfunctioning. For example, the processor 18 may detect a potential anomaly in a case where the electrostatic charge variation sensor 16 measures electrostatic charge variation that remains above or under a threshold value for a determined period of time, or the electrostatic charge variation sensor 16 is unresponsive to commands or requests.

In a case where a potential anomaly is not detected, the method 98 returns to block 100 where another electrostatic charge variation measurement is received.

In a case where a potential anomaly is detected, the method 98 moves to block 106.

In block 106, the processor 18 determines whether the electrostatic charge variation measurement received in block 100 is less than a threshold value. An electrostatic charge variation measurement less than the threshold value indicates that no electrostatic charge variation is present in a surrounding environment. Conversely, an electrostatic charge variation measurement greater than or equal to the threshold value indicates that electrostatic charge variation sensor 16 is currently measuring an electrostatic charge variation in the surrounding environment.

In a case where the electrostatic charge variation measurement received in block 100 is not less than the threshold value, the method 98 moves to block 108.

In block 108, the zero self-test as described above is executed. For example, blocks 52, 54, 56, 58, and 60 of the method 46 are executed. Once the zero self-test is executed, the method 98 moves to block 110.

In block 110, the processor 18 determines whether the electrostatic charge variation sensor 16 has passed the zero self-test. Namely, the processor 18 determines whether block 58 or block 60 in the method 46 was reached.

In a case where the electrostatic charge variation sensor 16 passed the zero self-test (i.e., reached block 58 in the method 46), the method 98 moves to block 112 where the processor 18 determines the electrostatic charge variation sensor 16 has passed the combination self-test and is functioning properly.

In a case where the electrostatic charge variation sensor 16 failed the zero self-test (i.e., reached block 60 in the method 46), the method 98 moves to block 114 where the processor 18 determines the electrostatic charge variation sensor 16 has failed the combination self-test and is malfunctioning.

Returning to block 106, in a case where the electrostatic charge variation measurement received in block 100 is less than the threshold value, the method 98 moves to block 116.

In block 116, the offset self-test as described above is executed. For example, blocks 70, 72, 74, 76, and 78 of the method 64 are executed. Once the offset self-test is executed, the method 98 moves to block 118.

In block 118, the processor 18 determines whether the electrostatic charge variation sensor 16 has passed the offset self-test. Namely, the processor 18 determines whether block 76 or block 78 in the method 64 was reached.

In a case where the electrostatic charge variation sensor 16 failed the offset self-test (i.e., reached block 78 in the method 64), the method 98 moves to block 114 where the processor 18 determines the electrostatic charge variation sensor 16 has failed the combination self-test and is malfunctioning.

In a case where the electrostatic charge variation sensor 16 passed the offset self-test (i.e., reached block 76 in the method 64), the method 98 moves to block 120.

In block 120, the performance self-test as described above is executed. For example, blocks 86, 88, 90, 92, 94, and 96 of the method 80 are executed. Once the performance self-test is executed, the method 98 moves to block 122.

In block 122, the processor 18 determines whether the electrostatic charge variation sensor 16 has passed the performance self-test. Namely, the processor 18 determines whether block 94 or block 96 in the method 80 was reached.

In a case where the electrostatic charge variation sensor 16 passed the performance self-test (i.e., reached block 94 in the method 80), the method 98 moves to block 112 where the processor 18 determines the electrostatic charge variation sensor 16 has passed the combination self-test and is functioning properly.

In a case where the electrostatic charge variation sensor 16 failed the performance self-test (i.e., reached block 96 in the method 80), the method 98 moves to block 114 where the processor 18 determines the electrostatic charge variation sensor 16 has failed the combination self-test and is malfunctioning.

In one embodiment, the combination self-test results are subsequently outputted from the processor 18 for further processing. For example, the device 10 may halt processing of the device 10 or output a warning to a user of the device 10 upon failure of the combination self-test.

In the embodiments described above, the processor 18 generates and provides stimulus signals to the stimulus electrodes 14. However, stimulus signals may also be generated by the electrostatic charge variation sensor 16, itself.

Figure 10:
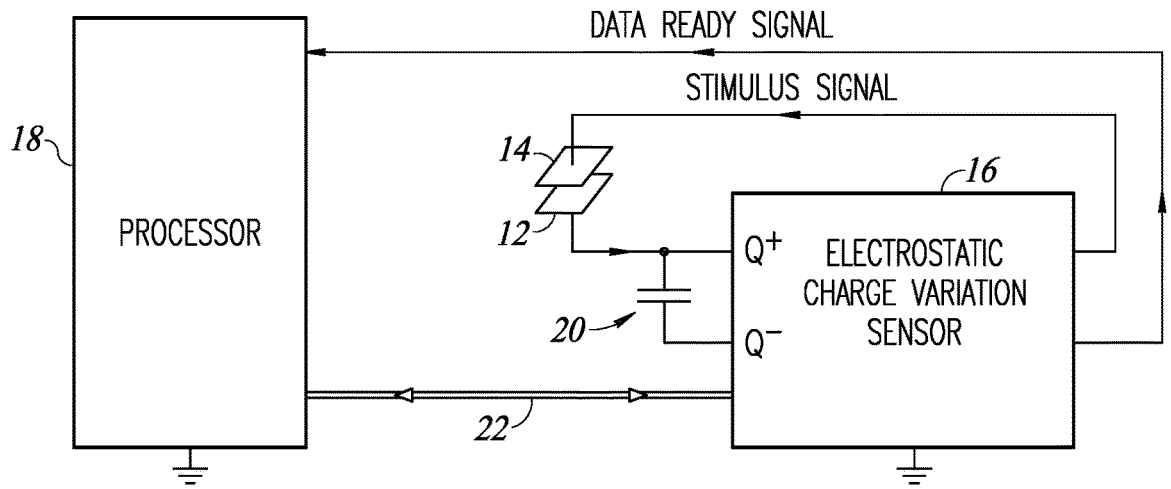
FIG. 10 is a block diagram of a device according to another embodiment disclosed herein.

FIG. 10 is a block diagram of the device 10 according to another embodiment disclosed herein. The embodiment shown in FIG. 10 is similar to the embodiment shown in FIG. 1. However, in contrast to the embodiment shown in FIG. 1, the electrostatic charge variation sensor 16 generates and provides the stimulus signal to the stimulus electrode 14, instead of the processor 18.

Figure 11:
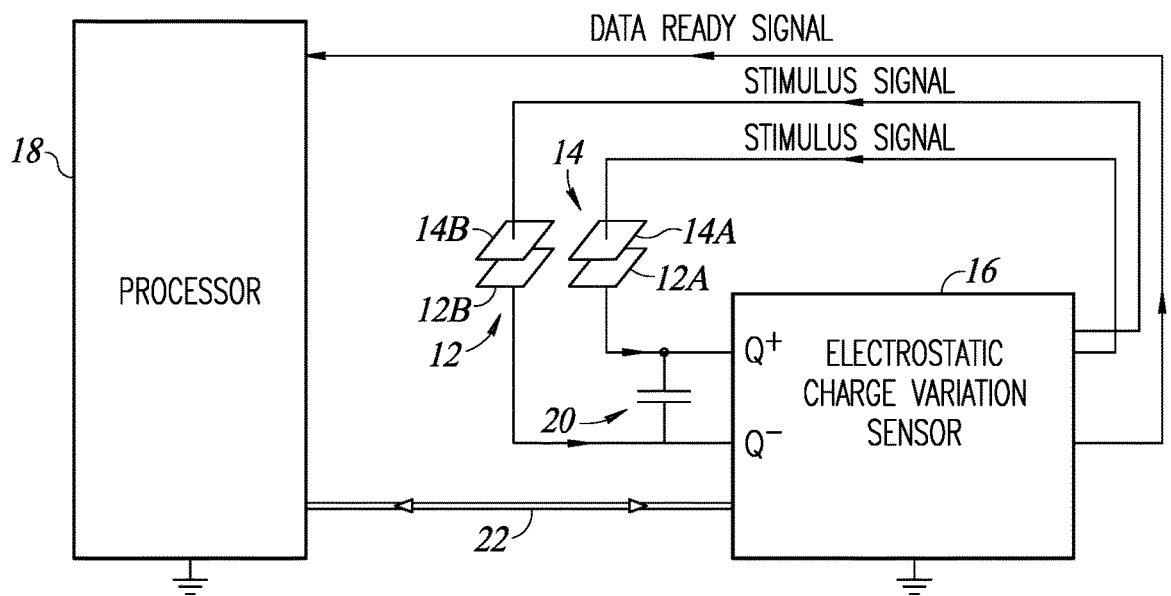
FIG. 11 is a block diagram of a device according to another embodiment disclosed herein.

FIG. 11 is a block diagram of the device 10 according to another embodiment disclosed herein. The embodiment shown in FIG. 11 is similar to the embodiment shown in FIG. 2. However, in contrast to the embodiment shown in FIG. 2, the electrostatic charge variation sensor 16 generates and provides the stimulus signals to the first stimulus electrode 14A and the second stimulus electrode 14B, instead of the processor 18. As discussed above, it is also possible that both of the first stimulus electrode 14A and the second stimulus electrode 14B receives complementary stimulus signals from the electrostatic charge variation sensor 16.

The various embodiments disclosed herein provide devices and methods for performing self-tests for an electrostatic charge variation sensor. The self-tests include a zero-self test, an offset self-test, and a performance self-test. The self-tests may be performed individually or in combination with each other. The self-tests may be performed while the electrostatic charge variation sensor is detecting a significant signal and without interruption to the application employing the electrostatic charge variation sensor.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a first stimulus electrode configured to transmit a stimulus signal;
a first receiving electrode underlying the first stimulus electrode, the first receiving electrode configured to receive an electrostatic charge variation in a surrounding environment and receive the stimulus signal transmitted from the first stimulus electrode;
an electrostatic charge variation sensor coupled to the first receiving electrode, the electrostatic charge variation sensor configured to:
generate a first electrostatic charge variation measurement of the electrostatic charge variation that indicates a change in electrostatic charge received by the first receiving electrode without the stimulus signal being transmitted by the first stimulus electrode and received by the first receiving electrode; and
generate a second electrostatic charge variation measurement of the electrostatic charge variation that indicates a change in electrostatic charge received by the first receiving electrode with the stimulus signal being transmitted by the first stimulus electrode and received by the first receiving electrode; and
a processor coupled to the electrostatic charge variation sensor, the processor configured to perform a self-test on the electrostatic charge variation sensor using the first electrostatic charge variation measurement and the second electrostatic charge variation measurement, and output a result of the self-test that indicates the electrostatic charge variation sensor has passed or failed the self-test.

2. The device of claim 1 wherein the first stimulus electrode is coupled to the processor, and the processor is configured to generate the stimulus signal.

3. The device of claim 1 wherein the first stimulus electrode is coupled to the electrostatic charge variation sensor, and the electrostatic charge variation sensor is configured to generate the stimulus signal.

4. The device of claim 1 wherein the first stimulus electrode and the first receiving electrode are embedded within a printed circuit board.

5. The device of claim 1 wherein
the stimulus signal is a constant voltage signal,
the electrostatic charge variation sensor generates the second electrostatic charge variation measurement in a case where the first electrostatic charge variation measurement is greater than a first threshold value, and
the processor determines the electrostatic charge variation sensor passed the self-test in a case where the second electrostatic charge variation measurement is less than a second threshold value, and determines the electrostatic charge variation sensor failed the self-test in a case where the second electrostatic charge variation measurement is not less than the second threshold value.

6. The device of claim 5, further comprising:
a second stimulus electrode configured to transmit the stimulus signal; and
a second receiving electrode underlying the second stimulus electrode, the second receiving electrode configured to receive the electrostatic charge variation in the surrounding environment,
the electrostatic charge variation sensor coupled to the first and second receiving electrodes,
the second electrostatic charge variation measurement being generated in response to the stimulus signal being transmitted by the first and second stimulus electrodes,
the electrostatic charge variation sensor configured to generate each of the first electrostatic charge variation measurement and the second electrostatic charge variation measurement based on a differential between electrostatic charge variation received on the first receiving electrode and electrostatic charge variation received on the second receiving electrode.

7. The device of claim 1 wherein
the stimulus signal is a synchronous pulse signal that is synchronized with an output data rate of the electrostatic charge variation sensor,
the electrostatic charge variation sensor generates the second electrostatic charge variation measurement in a case where the first electrostatic charge variation measurement is less than a threshold value, and
the processor determines the electrostatic charge variation sensor passed the self-test in a case where the second electrostatic charge variation measurement is offset from the first electrostatic charge variation measurement, and determines the electrostatic charge variation sensor failed the self-test in a case where the second electrostatic charge variation measurement is not offset from the first electrostatic charge variation measurement.

8. The device of claim 7, further comprising:
a second stimulus electrode configured to receive a constant voltage signal; and
a second receiving electrode underlying to the second stimulus electrode, the second receiving electrode configured to receive the electrostatic charge variation in the surrounding environment,
the first and second receiving electrodes coupled to positive and negative terminals, respectively, of the electrostatic charge variation sensor,
the electrostatic charge variation sensor configured to generate each of the first electrostatic charge variation measurement and the second electrostatic charge variation based on a differential between electrostatic charge variation received on the first receiving electrode and electrostatic charge variation received on the second receiving electrode.

9. The device of claim 1 wherein
the stimulus signal is an asynchronous signal that is unsynchronized with an output data rate of the electrostatic charge variation sensor,
the electrostatic charge variation sensor generates the second electrostatic charge variation measurement in a case where the first electrostatic charge variation measurement is less than a first threshold value, and
the processor determines the electrostatic charge variation sensor passed the self-test in a case where a parameter of the second electrostatic charge variation measurement is within a second threshold value of a parameter of the first electrostatic charge variation measurement, and determines the electrostatic charge variation sensor failed the self-test in a case where the parameter of the second electrostatic charge variation measurement is not within the second threshold value of the parameter of the first electrostatic charge variation measurement.

10. The device of claim 9 wherein
in a case where the asynchronous signal is a square wave, the parameter is a time-domain parameter, and
in a case where the asynchronous signal is a sinusoidal wave, the parameter is a frequency-domain parameter.

11. The device of claim 9, further comprising:
a second stimulus electrode configured to receive a constant voltage signal; and
a second receiving electrode underlying the second stimulus electrode, the second receiving electrode configured to receive the electrostatic charge variation in the surrounding environment,
the first and second receiving electrodes coupled to positive and negative terminals, respectively, of the electrostatic charge variation sensor,
the electrostatic charge variation sensor configured to generate each of the first electrostatic charge variation measurement and the second electrostatic charge variation based on a differential between electrostatic charge variation received on the first receiving electrode and electrostatic charge variation received on the second receiving electrode.

12. A method, comprising:
executing a first self-test on an electrostatic charge variation sensor, the first self-test including applying a constant voltage signal to a stimulus electrode that overlies a receiving electrode of the electrostatic charge variation sensor;
executing a second self-test on the electrostatic charge variation sensor, the second self-test including applying a synchronous pulse signal that is synchronized with an output data rate of the electrostatic charge variation sensor to the stimulus electrode;
executing a third self-test on the electrostatic charge variation sensor, the third self-test including applying an asynchronous signal that is unsynchronized with the output data rate to the stimulus electrode;
determining whether the electrostatic charge variation sensor is functioning or malfunctioning based on the first self-test, the second self-test, and the third self-test; and
outputting a result that indicates the electrostatic charge variation sensor is functioning or malfunctioning.

13. The method of claim 12 wherein the first self-test includes:
generating, by the electrostatic charge variation sensor, a first electrostatic charge variation measurement;
applying the constant voltage signal to the stimulus electrode in a case where the first electrostatic charge variation measurement is greater than a first threshold value;
generating, by the electrostatic charge variation sensor, a second electrostatic charge variation measurement in response to the constant voltage signal being applied to the stimulus electrode;
determining the electrostatic charge variation sensor passed the first self-test in a case where the second electrostatic charge variation measurement is less than a second threshold value; and
determining the electrostatic charge variation sensor failed the first self-test in a case where the second electrostatic charge variation measurement is not less than the second threshold value.

14. The method of claim 12 wherein the second self-test includes:
generating, by the electrostatic charge variation sensor, a first electrostatic charge variation measurement;
applying the synchronous pulse signal to the stimulus electrode in a case where the first electrostatic charge variation measurement is less than a threshold value;
generating, by the electrostatic charge variation sensor, a second electrostatic charge variation measurement in response to the synchronous pulse signal being applied to the stimulus electrode;
determining the electrostatic charge variation sensor passed the second self-test in a case where the second electrostatic charge variation measurement is offset from the first electrostatic charge variation measurement; and
determining the electrostatic charge variation sensor failed the second self-test in a case where the second electrostatic charge variation measurement is not offset from the first electrostatic charge variation measurement.

15. The method of claim 12 wherein the third self-test includes:
generating, by the electrostatic charge variation sensor, a first electrostatic charge variation measurement;
applying the asynchronous signal to the stimulus electrode in a case where the first electrostatic charge variation measurement is less than a first threshold value;
generating, by the electrostatic charge variation sensor, a second electrostatic charge variation measurement in response to the asynchronous signal being applied to the stimulus electrode;
determining the electrostatic charge variation sensor passed the third self-test in a case where a parameter of the second electrostatic charge variation measurement is within a second threshold value of a parameter of the first electrostatic charge variation measurement; and
determining the electrostatic charge variation sensor failed the third self-test in a case where the parameter of the second electrostatic charge variation measurement is not within the second threshold value of the parameter of the first electrostatic charge variation measurement.

16. The method of claim 12 wherein
the result indicates the electrostatic charge variation sensor is functioning in response to the electrostatic charge variation sensor passing the first self-test or passing both of the second self-test and the third self-test, and
the result indicates the electrostatic charge variation sensor is malfunctioning in response to the electrostatic charge variation sensor failing the first self-test, the second self-test, or the third self-test.

17. The method of claim 12, further comprising:
generating, by the electrostatic charge variation sensor, an electrostatic charge variation measurement;
executing the first self-test in a case where the electrostatic charge variation measurement is not less than a threshold value;
executing the second self-test in a case where the electrostatic charge variation measurement is less than the threshold value; and
executing the third self-test in a case where the electrostatic charge variation sensor passes the second self-test.

18. A method, comprising:
receiving, by a receiving electrode, a first electrostatic charge variation in a surrounding environment;
generating, by an electrostatic charge variation sensor coupled to the receiving electrode, a first electrostatic charge variation measurement in response to the first electrostatic charge variation being received by the receiving electrode;
transmitting, by a stimulus electrode overlying the receiving electrode, a stimulus signal;
receiving, by the receiving electrode, the stimulus signal;
generating, by the electrostatic charge variation sensor, a second electrostatic charge variation measurement in response to stimulus signal being received by the receiving electrode,
the first electrostatic charge variation measurement indicating a change in electrostatic charge received by the receiving electrode without the stimulus signal being transmitted by the stimulus electrode and received by the receiving electrode,
the second electrostatic charge variation measurement indicating a change in electrostatic charge received by the receiving electrode with the stimulus signal being transmitted by the stimulus electrode and received by the receiving electrode;
performing a self-test on the electrostatic charge variation sensor using the first electrostatic charge variation measurement and the second electrostatic charge variation measurement; and
outputting a result of the self-test that indicates the electrostatic charge variation sensor has passed or failed the self-test.

19. The method of claim 18 wherein the stimulus signal is one of a constant voltage signal, a synchronous pulse signal that is synchronized with an output data rate of the electrostatic charge variation sensor, or an asynchronous signal that is unsynchronized with the output data rate of the electrostatic charge variation sensor.

20. The method of claim 18, further comprising:
generating, by the electrostatic charge variation sensor, the stimulus signal.

21. A device, comprising:
a first stimulus electrode configured to transmit a stimulus signal, the stimulus signal being a constant voltage signal;
a first receiving electrode underlying the first stimulus electrode, the first receiving electrode configured to receive an electrostatic charge variation in a surrounding environment;

an electrostatic charge variation sensor coupled to the first receiving electrode, the electrostatic charge variation sensor configured to generate a first electrostatic charge variation measurement of the electrostatic charge variation and generate a second electrostatic charge variation measurement of the electrostatic charge variation, the second electrostatic charge variation measurement being generated in a case where the first electrostatic charge variation measurement is greater than a first threshold value and in response to the stimulus signal being transmitted by the first stimulus electrode; and a processor coupled to the electrostatic charge variation sensor, the processor configured to perform a self-test on the electrostatic charge variation sensor using the first electrostatic charge variation measurement and the second electrostatic charge variation measurement, and output a result of the self-test that indicates the electrostatic charge variation sensor has passed or failed the self-test, the processor determines the electrostatic charge variation sensor passed the self-test in a case where the second electrostatic charge variation measurement is less than a second threshold value, and determines the electrostatic charge variation sensor failed the self-test in a case where the second electrostatic charge variation measurement is not less than the second threshold value.

22. The device of claim 21, further comprising:

a second stimulus electrode configured to transmit the stimulus signal; and a second receiving electrode underlying the second stimulus electrode, the second receiving electrode configured to receive the electrostatic charge variation in the surrounding environment, the electrostatic charge variation sensor coupled to the first and second receiving electrodes, the second electrostatic charge variation measurement being generated in response to the stimulus signal being transmitted by the first and second stimulus electrodes, the electrostatic charge variation sensor configured to generate each of the first electrostatic charge variation measurement and the second electrostatic charge variation based on a differential between electrostatic charge variation received on the first receiving electrode and electrostatic charge variation received on the second receiving electrode.

\* \* \* \* \*